United States Patent
Ma et al.

(10) Patent No.: US 7,852,636 B2
(45) Date of Patent: Dec. 14, 2010

(54) ELECTRONIC DEVICE AND DUMMY CONNECTOR THEREOF

(75) Inventors: Xiao-Feng Ma, Shenzhen (CN); Zheng-Heng Sun, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 85 days.

(21) Appl. No.: 12/424,526

(22) Filed: Apr. 15, 2009

(65) Prior Publication Data
US 2010/0246145 A1 Sep. 30, 2010

(30) Foreign Application Priority Data
Mar. 25, 2009 (CN) .................. 2009 1 0301110

(51) Int. Cl.
*H05K 9/00* (2006.01)

(52) U.S. Cl. .................. 361/799; 361/753; 439/607.07

(58) Field of Classification Search .................. 361/753, 361/799, 800, 816, 818; 174/50.52, 520, 174/350; 439/607.07, 607.11, 607.32
See application file for complete search history.

(56) References Cited

U.S. PATENT DOCUMENTS

| 5,645,454 | A | * | 7/1997 | Kosmala ..................... 439/675 |
| 5,679,006 | A | * | 10/1997 | Madelaine ................... 439/63 |
| 6,211,457 | B1 | * | 4/2001 | Cama et al. ................. 174/380 |
| 7,088,592 | B2 | * | 8/2006 | Su et al. ..................... 361/753 |
| 7,466,564 | B2 | * | 12/2008 | Harada et al. ............... 361/814 |
| 2009/0181576 | A1 | * | 7/2009 | Yamaguchi et al. ......... 439/587 |

* cited by examiner

*Primary Examiner*—Dameon E Levi
(74) *Attorney, Agent, or Firm*—Zhigang Ma

(57) ABSTRACT

An electronic device includes a shell, a printed circuit board, and a dummy connector. The shell defines a through hole and accommodates the printed circuit board. The dummy connector includes a main body and a grounded portion. The main body includes a projection engaging the through hole. The grounded portion extends from the main body and is electrically fixed to the printed circuit board to be grounded.

5 Claims, 5 Drawing Sheets

ELECTRONIC DEVICE AND DUMMY CONNECTOR THEREOF

BACKGROUND

1. Technical Field

The present disclosure relates to electronic devices and, particularly, to an electronic device with a dummy connector.

2. Description of Related Art

Referring to FIGS. 4 and 5, a computer system 300 includes a shell 310 and a printed circuit board 320 accommodated therein. The printed circuit board 320 includes a plurality of connectors 322, each fixed on the printed circuit board 320 by inserting pins of the connector 322 into corresponding fixing holes 324 defined in the printed circuit board 320, and welding the pins to the printed circuit board 320 by solder. The shell 310 defines a plurality of through holes 312. The plurality of connectors 322 are exposed respectively through the plurality of through holes 312 to connect to corresponding system elements, enabling communication therewith.

With computer systems available in many different configurations, locations of connectors can change, and in certain cases even removal of some is necessary. If one of the plurality of connectors 322 is not used, a corresponding through hole 312 in the shell 310 should be eliminated as well to avoid electromagnetic leakage therethrough. Accordingly, production process of the shell 310 needs to be adjusted. However, such an adjustment is complicated and costly.

DETAILED DESCRIPTION

Figure 1:
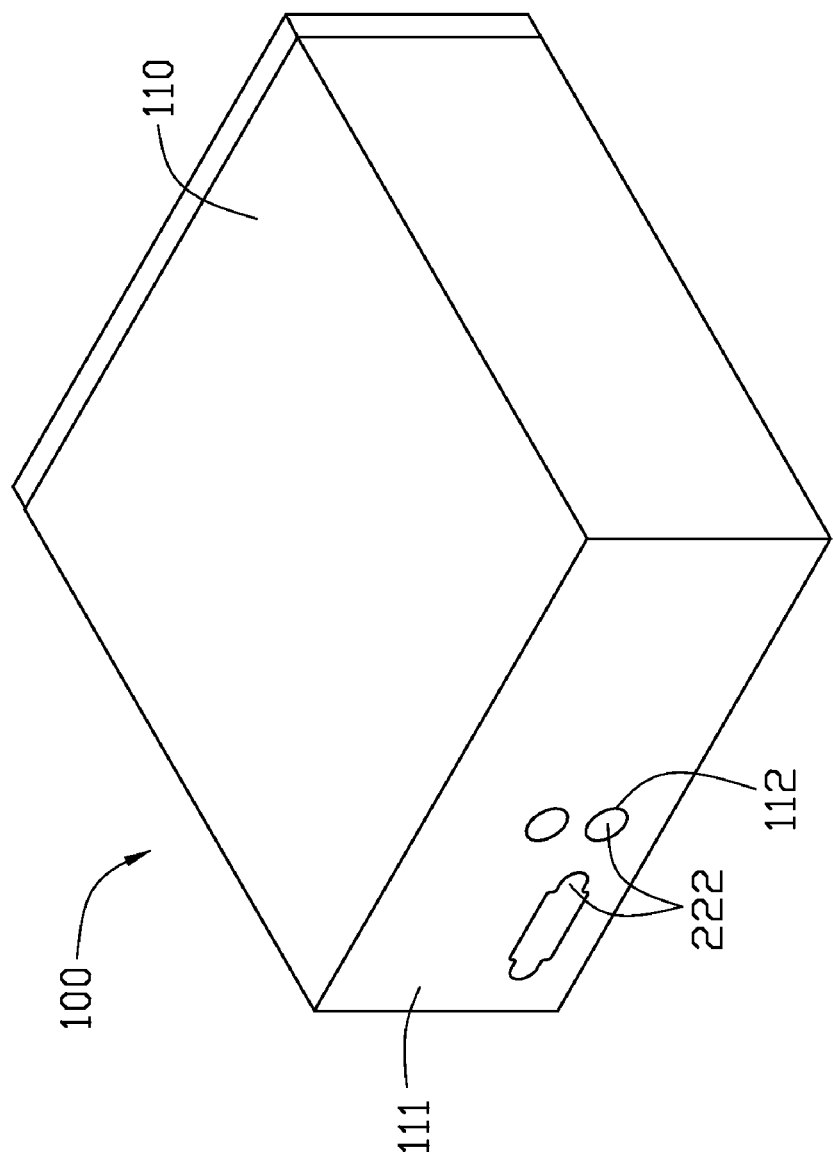
FIG. 1 is a schematic diagram of an embodiment of an electronic device.
Figure 2:
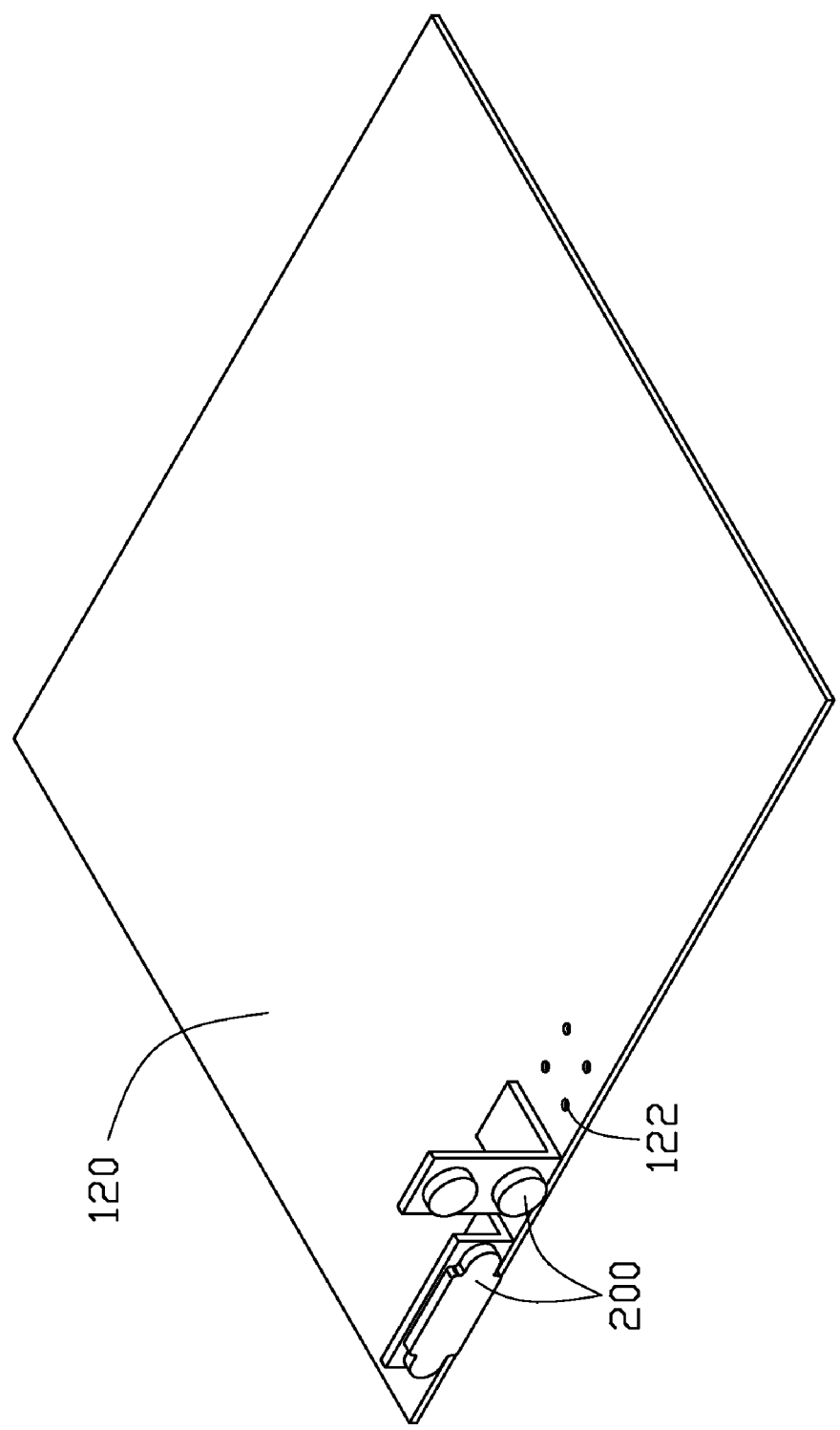
FIG. 2 is a schematic diagram of a printed circuit board and a plurality of dummy connectors of the electronic device of FIG. 1.
Figure 3:
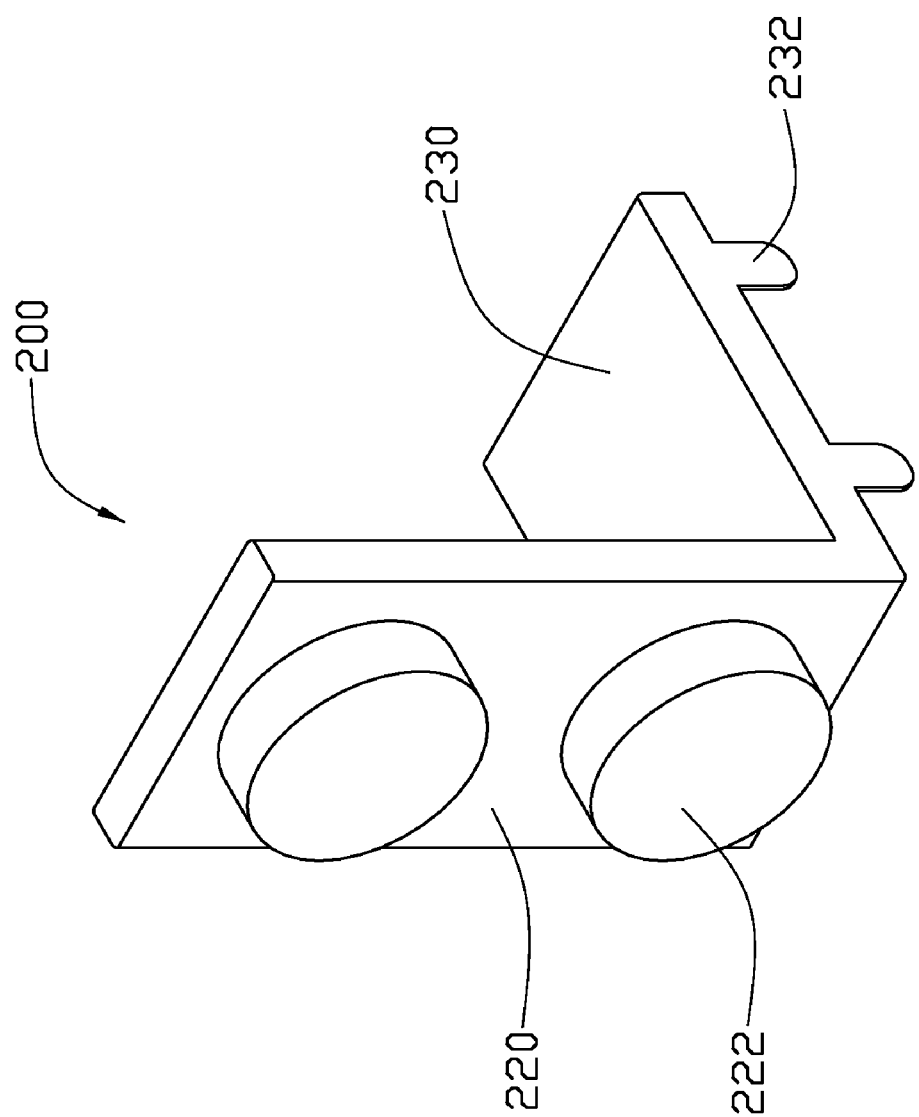
FIG. 3 is an enlarged, isometric view of one dummy connector of FIG. 2.
Figure 4:
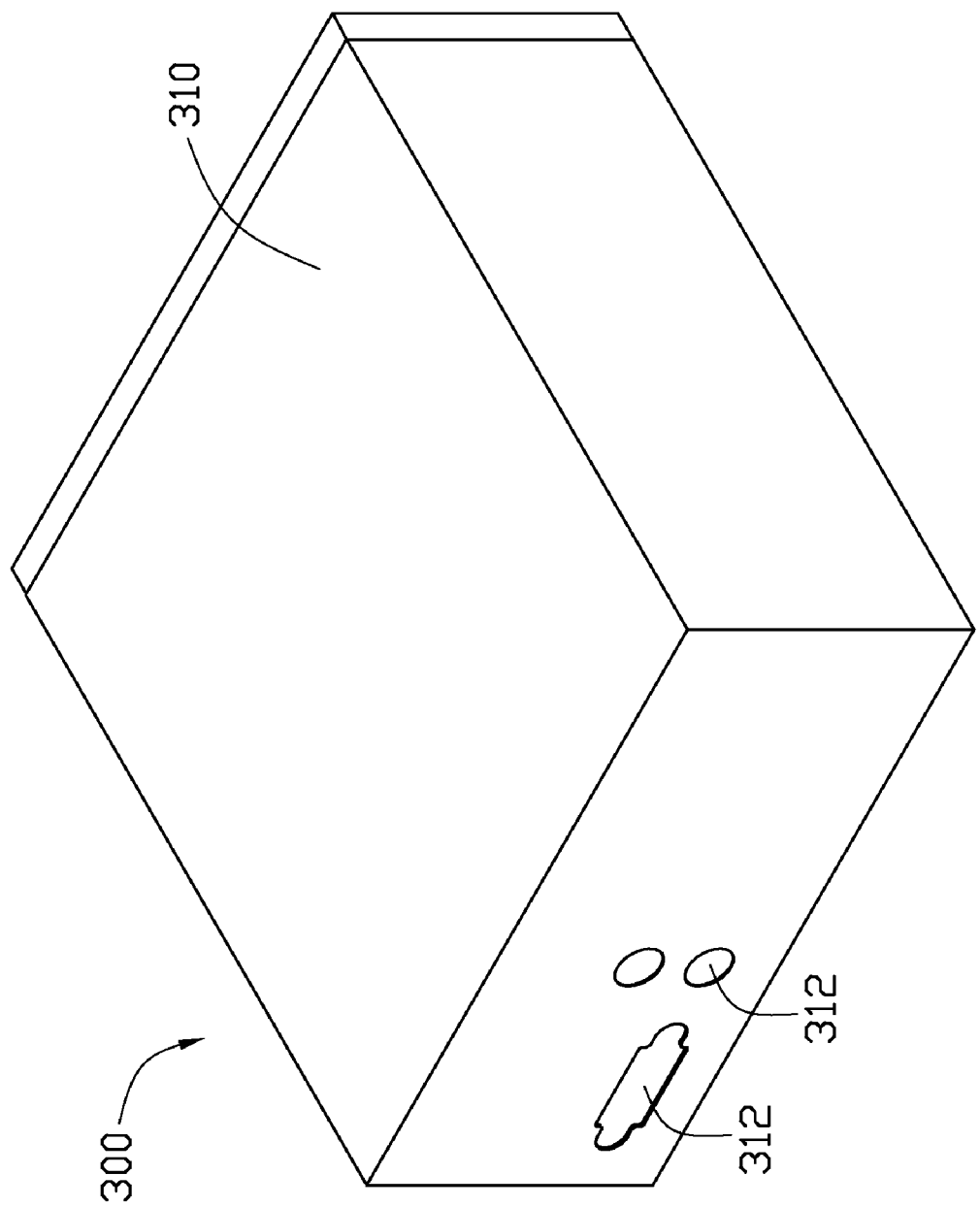
FIG. 4 is a schematic diagram of a related art computer system.
Figure 5:
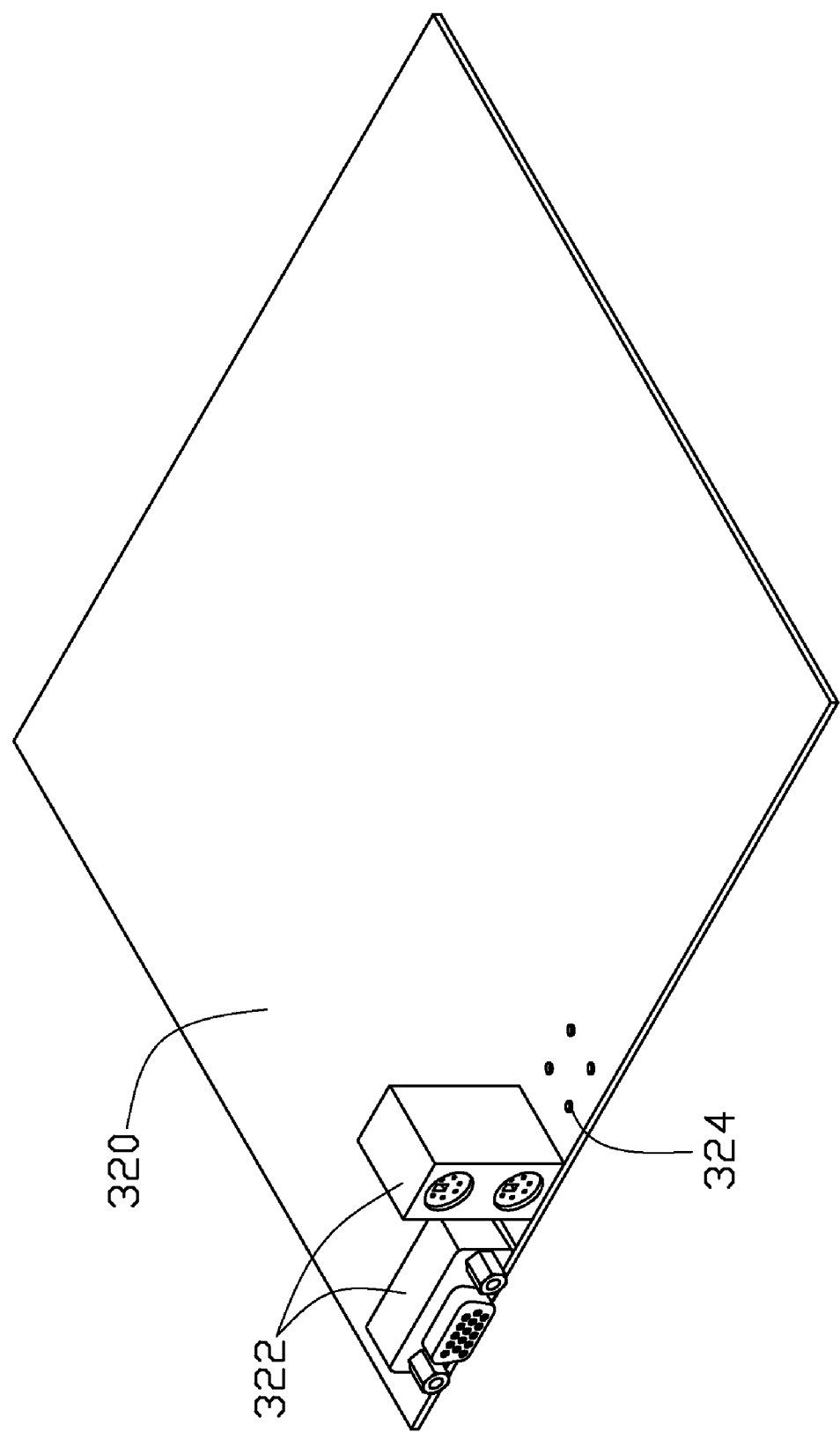
FIG. 5 is a schematic diagram of a printed circuit board mountable in the computer system of FIG. 4.

Referring to FIGS. 1 to 3, an exemplary embodiment of an electronic device 100 includes a shell 110, a printed circuit board 120 accommodated in the shell 110, and a plurality of dummy connectors 200 configured to replace corresponding functional connectors (not shown) of the printed circuit board 120. In one embodiment, the electronic device 100 is a chassis of a desktop computer, the printed circuit board 120 is a motherboard, and the dummy connectors 200 are of metal material, although the disclosure is not limited thereto.

The shell 110 includes a sidewall 111 perpendicular to the printed circuit board 120. The sidewall 111 defines a plurality of through holes 112 therein. The printed circuit board 120 defines a plurality of fixing holes 122 in a side adjacent to the sidewall 111 of the printed circuit board 120.

Each of the dummy connectors 200 is substantially L-shaped and includes a main body 220 and a grounded portion 230 extending perpendicularly from an end of the main body 220. The grounded portion 230 includes a plurality of grounded pins 232 similar to grounded pins of a corresponding functional connector, the plurality of grounded pins 232 extending away from the main body 220. Accordingly, the plurality of grounded pins 232 can be received in the corresponding fixing holes 122 defined in the printed circuit board 120 and soldered to the printed circuit board 120, thus being grounded. The main body 220 includes a plurality of projections 222 matching the corresponding through holes 112 defined in the shell 110, respectively. Therefore, the plurality of projections 222 can be received in the corresponding through holes 112, to seal the corresponding through holes 112. As a result, electromagnetic leakage from the printed circuit board 120 is avoided.

The plurality of dummy connectors 200 may be designed to match the shape of PS/2 connectors, radio frequency connectors, or others, according to need.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device comprising:
    a shell defining at least one through hole;
    a printed circuit board accommodated in the shell; and
    at least one dummy connector, each dummy connector comprising:
        a main body comprising at least one projection each for engaging one corresponding through hole; and
        a grounded portion extending from the main body and electrically fixed to and grounded by the printed circuit board.

2. The electronic device of claim 1, wherein the at least one dummy connector is substantially L-shaped, with the grounded portion thereof extending perpendicularly from an end of the main body.

3. The electronic device of claim 1, wherein the grounded portion comprises a plurality of grounded pins, extending away from the main body to engage the printed circuit board.

4. The electronic device of claim 3, wherein the printed circuit board defines a plurality of fixing holes, in which the plurality of grounded pins are received and welded to the printed circuit board by solder.

5. The electronic device of claim 1, wherein the at least one dummy connector is metal.

* * * * *